(12) United States Patent
Cai et al.

(10) Patent No.: US 9,570,475 B2
(45) Date of Patent: Feb. 14, 2017

(54) ARRAY SUBSTRATE AND MANUFACTURE METHOD THEREOF

(71) Applicants: BOE TECHNOLOGY GROUP CO., LTD., Beijing (CN); HEFEI XINSHENG OPTOELECTRONICS TECHNOLOGY CO., LTD., Hefei, Anhui Province (CN)

(72) Inventors: Zhenfei Cai, Beijing (CN); Jian Zhang, Beijing (CN); Xingxing Song, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui Province (CN)

(*) Notice: Subject to any disclaimer, the term of this patent is extended or adjusted under 35 U.S.C. 154(b) by 0 days.

(21) Appl. No.: 14/751,854

(22) Filed: Jun. 26, 2015

(65) Prior Publication Data

US 2016/0104727 A1    Apr. 14, 2016

(30) Foreign Application Priority Data

Oct. 11, 2014 (CN) .......................... 2014 1 0534573

(51) Int. Cl.
*H01L 27/12* (2006.01)
*H01L 23/544* (2006.01)

(52) U.S. Cl.
CPC .......... *H01L 27/124* (2013.01); *H01L 23/544* (2013.01); *H01L 27/1222* (2013.01); *H01L 2223/5442* (2013.01); *H01L 2223/54426* (2013.01)

(58) Field of Classification Search
CPC . H01L 27/1218; H01L 27/124; H01L 27/1296
See application file for complete search history.

(56) References Cited

U.S. PATENT DOCUMENTS

| 2004/0222187 A1* | 11/2004 | Lin ........................ G03F 9/708 216/65 |
| 2004/0263703 A1* | 12/2004 | You ................... G02F 1/136277 349/42 |

(Continued)

FOREIGN PATENT DOCUMENTS

| CN | 1577022 A | 2/2005 |
| CN | 1909249 A | 2/2007 |

(Continued)

OTHER PUBLICATIONS

First Chinese Office Action dated Aug. 2, 2016; Appln. No. 201410534573.2.

*Primary Examiner* — Daniel Whalen
(74) *Attorney, Agent, or Firm* — Ladas & Parry LLP

(57) ABSTRACT

Embodiments of the disclosure provide an array substrate and a manufacture method thereof. The array substrate comprises a display region and a non-display region, the display region comprises a transistor, the transistor comprises a source electrode, a drain electrode and an active layer, the source electrode and the drain electrode are provided on the active layer and are respectively provided at two ends of the active layer. The non-display region is provided with an alignment mark, the alignment mark is provided in a same layer as the active layer and is configured for aligning the source electrode and the drain electrode with the active layer in the case of re-fabricating the source electrode and the drain electrode.

6 Claims, 3 Drawing Sheets

(56) References Cited

U.S. PATENT DOCUMENTS

2007/0029614 A1    2/2007    Shiota et al.
2008/0157099 A1*    7/2008    Yang .................... G09G 3/3233
                                                                        257/83
2015/0200304 A1*    7/2015    Kim .................... H01L 29/7869
                                                                        257/43

FOREIGN PATENT DOCUMENTS

CN          101211963 A    7/2008
CN          103809324 A    5/2014

* cited by examiner

ARRAY SUBSTRATE AND MANUFACTURE METHOD THEREOF

TECHNICAL FIELD

Embodiments of the disclosure relate to an array substrate and a manufacture method thereof.

BACKGROUND

In the process of manufacturing a thin film transistor liquid crystal display panel, a display panel motherboard is firstly obtained by bonding an array substrate motherboard comprising a plurality of sub array substrates and a color filter substrate motherboard comprising a plurality of sub color filter substrates, then the bonded display panel motherboard is cut and divided into a plurality of display panels.

In a manufacture process of the array substrate motherboard, source and drain electrodes and an active layer of a thin film transistor are generally formed by using a dual-tone mask. That is, a source-drain electrode metal film and an active layer film are exposed by using the dual-tone mask, then the source and drain electrodes and the active layer are formed after two wet etching processes and two dry etching processes; in this way, costs are greatly saved.

After the formation of the source and drain electrodes and the active layer is completed, if any defects are found in the source and drain electrodes or the active layer in a later test process (for example, a data line connected with the source electrode is disconnected or a connection between the drain electrode and the active layer is poor, etc.), it is required to strip off the source-drain electrode metal film and re-fabricate the source and drain electrodes, that is, to re-perform the processes of forming the source-drain electrode metal film, exposing, developing and etching the source-drain electrode metal film. The process of re-fabricating the source and drain electrodes is called as a rework process. If the source and drain electrodes need to be re-fabricated, the source and drain electrodes to be re-fabricated must be precisely aligned with the previously fabricated active layer so as to ensure that the performance of the resultant transistor is normal.

At present, in order to achieve precise alignment of the source and drain electrodes with the active layer in the rework process of reforming the source and drain electrodes, a mask for forming the source and drain electrodes should be aligned with an alignment mark formed in a gate electrode metal layer. However, only aligning the mask for forming the source and drain electrodes with the alignment mark in the gate electrode metal layer cannot achieve the precise alignment between the source and drain electrodes and the active layer, and misalignment between the source and drain electrodes and the active layer often causes abnormal operations of the thin film transistor, and even leads to failure of the whole batch of products.

SUMMARY

According to embodiments of the present disclosure, there is provided an array substrate. The array substrate comprises a display region and a non-display region, the display region comprises a transistor, the transistor comprises a source electrode, a drain electrode and an active layer, the source electrode and the drain electrode are provided on the active layer and are respectively provided at two ends of the active layer. The non-display region is provided with an alignment mark, the alignment mark is provided in a same layer as the active layer and is configured for aligning the source electrode and the drain electrode with the active layer in the case of re-fabricating the source electrode and the drain electrode.

For example, the active layer comprises a semiconductor layer and an ohmic contact layer which are sequentially stacked, the ohmic contact layer is provided on the semiconductor layer, and the ohmic contact layer is provided to correspond to and in contact with the source electrode and the drain electrode; a film for forming the semiconductor layer and a film for forming the ohmic contact layer are further formed in the non-display region; and the alignment mark comprises a first alignment mark, the first alignment mark is formed in the film for forming the semiconductor layer and in the film for forming the ohmic contact layer.

For example, the alignment mark further comprises a second alignment mark, the second alignment mark and the first alignment mark are separated from each other, and the second alignment mark is formed in the film for forming the ohmic contact layer.

For example, the second alignment mark and the first alignment mark are of same shape and size, the first alignment mark and the second alignment mark are symmetric with respect to a straight line as a symmetry axis, and the straight line passes through a midpoint of a line connecting a central point of the first alignment mark and a central point of the second alignment mark and is perpendicular to the line connecting the central point of the first alignment mark and the central point of the second alignment mark.

For example, the first alignment mark comprises a strip-shaped via hole provided in the film for forming the semiconductor layer and in the film for forming the ohmic contact layer, and the second alignment mark comprises a strip-shaped via hole provided in the film for forming the ohmic contact layer.

For example, in each of the first alignment mark and the second alignment mark, there are a plurality of strip-shaped via holes; length directions of a portion of the strip-shaped via holes are parallel to a length direction of the array substrate, and length directions of the other portion of the strip-shaped via holes are parallel to a width direction of the array substrate.

For example, there are a plurality of alignment marks, and the plurality of alignment marks are evenly distributed in the non-display region.

According to the embodiments of the present disclosure, there is provided a manufacture method of an array substrate. The manufacture method of the array substrate comprises: forming a transistor in a display region, the transistor comprises a source electrode, a drain electrode and an active layer, the source electrode and the drain electrode are provided on the active layer and are respectively provided at two ends of the active layer. The method further comprises: forming an alignment mark in a non-display region, and the alignment mark and the active layer are simultaneously formed in a same layer.

For example, the method comprises forming the active layer, and the forming the active layer comprises: firstly forming an intermediate pattern of an ohmic contact layer and a semiconductor layer, and then forming the ohmic contact layer; the intermediate pattern of the ohmic contact layer and the semiconductor layer are simultaneously formed; the forming the alignment mark comprises: forming a first alignment mark, the first alignment mark, the intermediate pattern of the ohmic contact layer, and the semiconductor layer are simultaneously formed.

For example, the forming the alignment mark further comprises: forming a second alignment mark; and the second alignment mark and the ohmic contact layer are simultaneously formed.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
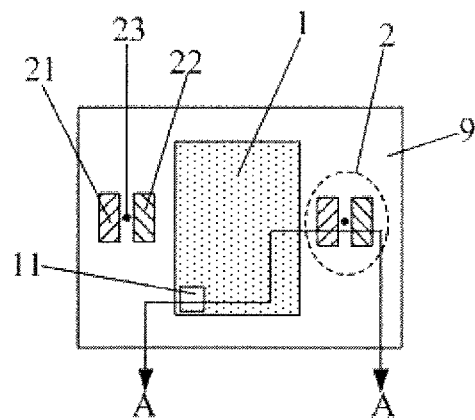
FIG. 1 is a structural top view illustrating an array substrate according to embodiments of the disclosure.
Figure 2:
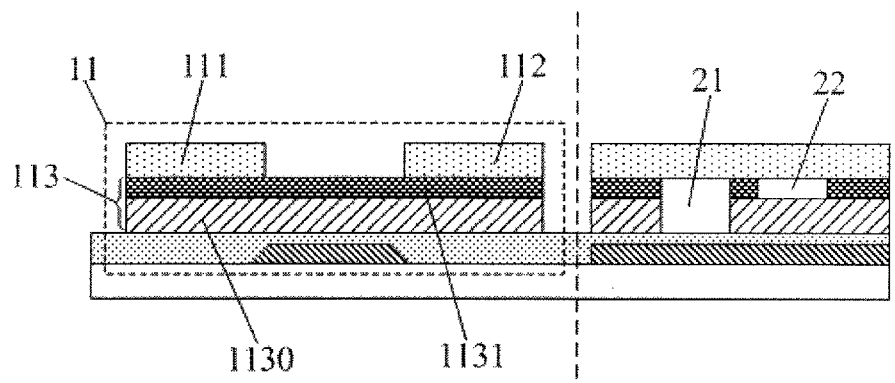
FIG. 2 is a structural sectional view illustrating the array substrate of FIG. 1 taken along line A-A.

Embodiments of the present disclosure provide an array substrate. As shown in FIG. 1 and FIG. 2, the array substrate comprises a display region 1 and a non-display region 9, the display region 1 comprises a transistor 11, the transistor 11 comprises a source electrode 111, a drain electrode 112 and an active layer 113, and the source electrode 111 and the drain electrode 112 are provided on the active layer 113 and are respectively provided at two ends of the active layer 113; the non-display region 9 is provided with an alignment mark 2, the alignment mark 2 is provided in a same layer as the active layer 113 and is configured for aligning the source electrode 111 and the drain electrode 112 with the active layer 113 in the case of re-fabricating the source electrode 111 and the drain electrode 112.

Due to the alignment mark 2, a pattern of the source electrode 111 and a pattern of the drain electrode 112 are respectively precisely aligned with the two ends of the active layer 113 in the case of re-fabricating the source electrode 111 and the drain electrode 112, thereby avoiding abnormal operations of the transistor 11 caused by misalignment of the source electrode 111 and the drain electrode 112 with the active layer 113, and further avoiding unnecessary waste caused by failure of products.

For example, the active layer 113 comprises a semiconductor layer 1130 and an ohmic contact layer 1131 which are sequentially stacked, the ohmic contact layer 1131 is provided on the semiconductor layer 1130, and the ohmic contact layer 1131 is provided to correspond to and in contact with the source electrode 111 and the drain electrode 112. A film for forming the semiconductor layer 1130 and a film for forming the ohmic contact layer 1131 are further provided in the non-display region 9; the alignment mark 2 comprises a first alignment mark 21, and the first alignment mark 21 is formed in the film for forming the semiconductor layer 1130 and in the film for forming the ohmic contact layer 1131.

In the case that the source electrode 111 and the drain electrode 112 are stripped off and re-fabricated, a metal film for forming the source electrode 111 and the drain electrode 112 is directly formed on the ohmic contact layer 1131 which has been fabricated and then the metal film for forming the source electrode 111 and the drain electrode 112 is patterned by using a mask; if this mask only aligns with the alignment mark previously formed in a gate electrode metal layer below the active layer 113, the misalignment between patterns of the source electrode 111 and the drain electrode 112 and the pattern of the active layer 113 will be larger and the abnormal operations of the transistor 11 will be easily caused due to a cumulative effect of misalignments (that is, the alignment mark formed in the gate electrode metal layer is configured for aligning upon fabricating the respective layers on the gate electrode metal layer such as the semiconductor layer 1130 and the ohmic contact layer 1131, the respective layers after being formed will have more or less misalignments; the source electrode 111 and the drain electrode 112 are reformed on the ohmic contact layer 1131, and in this case, the misalignment will be larger if the mask for forming the source electrode 111 and the drain electrode 112 still aligns with the alignment mark formed in the gate electrode metal layer). In the embodiments of the disclosure, the first alignment mark 21 is formed in the film for forming the semiconductor layer 1130 and in the film for forming the ohmic contact layer 1131, the film for forming the semiconductor layer 130 and the film for forming the ohmic contact layer 1131 are closer to the metal film for forming the source electrode 111 and the drain electrode 112 than the gate electrode metal layer, and the patterns of the source electrode 111 and the drain electrode 112 are aligned with the active layer 113 by using the first alignment mark 21; so, misalignment of the source electrode 111 and the drain electrode 112 with the active layer 113 upon re-fabricating the source electrode 111 and the drain electrode 112 is greatly reduced.

For example, the alignment mark 2 further comprises a second alignment mark 22, the second alignment mark 22 and the first alignment mark 21 are separated from each other, and the second alignment mark 22 is formed in the film for forming the ohmic contact layer 1131. The second alignment mark 22 makes the alignment of the source electrode 111 and the drain electrode 112 with the active layer 113 more precise upon re-fabricating the source electrode 111 and the drain electrode 112.

For example, the second alignment mark 22 and the first alignment mark 21 are of same shape and size, the first alignment mark 21 and the second alignment mark 22 are symmetric with respect to a straight line as a symmetry axis, and the straight line passes through a midpoint of a line connecting a central point of the first alignment mark 21 and a central point of the second alignment mark 22 and is perpendicular to the line connecting the central point of the first alignment mark 21 and the central point of the second alignment mark 22. So, the aligning area of each alignment mark 2 is increased, so as to achieve a more precise alignment. For example, in the case that the mask for forming the source electrode 111 and the drain electrode 112 is aligned with the active layer 113, an alignment device will firstly read coordinate values of the midpoint 23 of the line connecting the central point of the first alignment mark 21 and the central point of the second alignment mark 22, then perform alignment by using the first alignment mark 21 and the second alignment mark 22; and in this case, the first alignment mark 21 and the second alignment mark 22 which are symmetrically disposed will make the alignment more convenient and easy.

Figure 3:
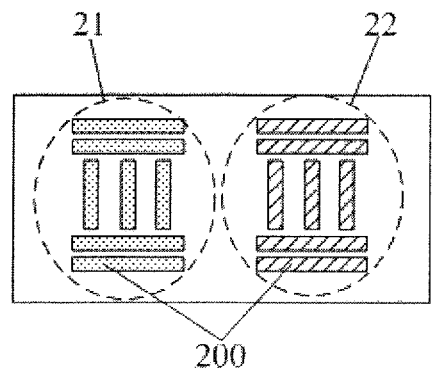
FIG. 3 is a structural top view illustrating a first alignment mark and a second alignment mark in FIG. 1.

For example, as shown in FIG. 3, the first alignment mark 21 comprises a strip-shaped via hole 200 provided in the film for forming the semiconductor layer 1130 and in the film for forming the ohmic contact layer 1131, and the second alignment mark 22 comprises a strip-shaped via hole 200 provided in the film for forming the ohmic contact layer 1131. The strip-shaped via holes 200 make the alignment of the source electrode 111 and the drain electrode 112 with the active layer 113 more convenient and easy upon re-fabricating the source electrode 111 and the drain electrode 112.

For example, in each of the first alignment mark 21 and the second alignment mark 22, there are a plurality of strip-shaped via holes 200, length directions of a portion of the strip-shaped via holes 200 are parallel to a length direction of the array substrate, and length directions of the other portion of the strip-shaped via holes 200 are parallel to a width direction of the array substrate. In this way, the mask for forming the source electrode 111 and the drain electrode 112 are easily adjusted vertically and horizontally by using the strip-shaped via holes 200 which are vertically and horizontally provided, thereby realizing precise alignment of the source electrode 111 and the drain electrode 112 with the active layer 113.

It should be noted that, the pattern shapes of the via holes of the first alignment mark 21 and the second alignment mark 22 are not limited to the above-mentioned strip shape, and may be any other shape, such as a ring shape, a rectangular shape and so on, as long as alignment is implemented.

For example, there are a plurality of alignment marks 2, and the plurality of alignment marks 2 are evenly distributed in the non-display region 9. In this way, the alignment of the source electrode 111 and the drain electrode 112 with the active layer 113 will be more precise.

Embodiments of the present disclosure further provide a manufacture method of an array substrate. The method comprises forming a transistor in a display region 1, and the forming the transistor comprises forming a source electrode, a drain electrode and an active layer. The method further comprises forming an alignment mark in a non-display region 9, and the alignment mark and the active layer are simultaneously formed in a same layer.

For example, the active layer comprises a semiconductor layer and an ohmic contact layer which are sequentially stacked. The forming the active layer comprises: firstly forming an intermediate pattern of the ohmic contact layer and the semiconductor layer (the intermediate pattern of the ohmic contact layer is identical with the pattern of the semiconductor layer), then forming the ohmic contact layer (the pattern of the ohmic contact layer is identical with the pattern of the source and drain electrodes, i.e., the ohmic contact layer is obtained by removing a portion of the intermediate pattern of the ohmic contact layer which is provided between the source electrode and the drain electrode). The forming the alignment mark comprises forming a first alignment mark, the first alignment mark, the intermediate pattern of the ohmic contact layer, and the semiconductor layer are simultaneously formed. The formation of the first alignment mark will not increase an additional manufacture process.

For example, the forming the alignment mark further comprises forming a second alignment mark, the second alignment mark and the ohmic contact layer are formed simultaneously. The formation of the second alignment mark will not increase an additional manufacture process.

The process of forming the first alignment mark and the second alignment mark is illustrated in FIG. 4a to FIG. 4e. It should be noted that, FIG. 4a to FIG. 4e only illustrate the process of forming the first alignment mark and the second alignment mark in the non-display region of the array substrate.

Figure 4A:
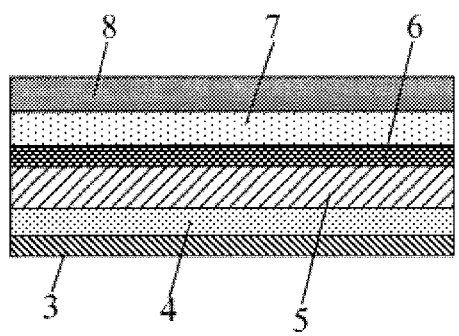
FIG. 4a is a schematic view of forming respective films in a non-display region of the array substrate.

Referring to FIG. 4a to FIG. 4e, the manufacture method of the array substrate according to the embodiments of the present disclosure comprises steps of:

Step S1: forming a gate electrode metal film 3 for example on a glass base substrate, forming a gate electrode by a patterning process, sequentially forming a gate insulation film 4, a semiconductor layer film 5, an ohmic contact layer film 6 and a source-drain electrode metal film 7 on the gate electrode, and coating a photoresist layer 8 on the source-drain electrode metal film 7 (as shown in FIG. 4a).

It should be noted that, the gate electrode metal film 3, the gate insulation layer film 4, the semiconductor layer film 5, the ohmic contact layer film 6 and the source-drain electrode metal film 7 and the photoresist layer 8 all extend to cover the non-display region.

Figure 4B:
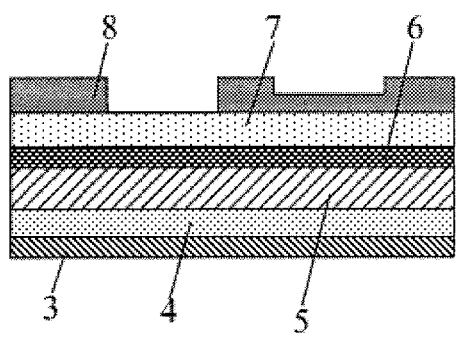
FIG. 4b is a schematic view of exposing and developing a photoresist layer by using a dual-tone mask.

Step S2: exposing and developing the photoresist layer 8 by using a dual-tone mask to form a photoresist completely removed region, a photoresist partially removed region, and a photoresist completely reserved region. The second alignment mark corresponds to a portion of partially exposed pattern of the dual-tone mask, and the first alignment mark corresponds to a portion of completely exposed pattern of the dual-tone mask. That is, the second alignment mark corresponds to a portion of the photoresist partially removed region, and the first alignment mark corresponds to a portion of the photoresist completely removed region (as shown in FIG. 4b).

Figure 4C:
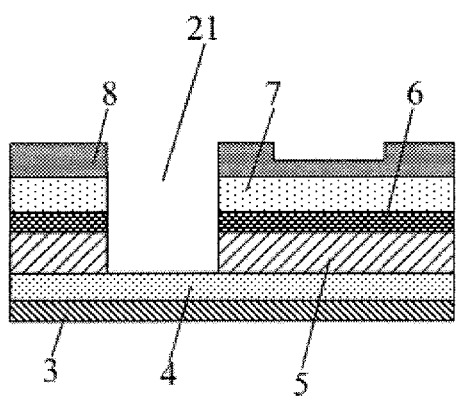
FIG. 4c is a schematic view of forming a first alignment mark.

Step S3: performing a wet etching process on a portion of the source-drain electrode metal film 7 corresponding to the first alignment mark: then performing a dry etching on portions of the semiconductor layer film 5 and the ohmic contact layer film 6 corresponding to the first alignment mark, so the first alignment mark 21 is formed (as shown in FIG. 4c).

Figure 4D:
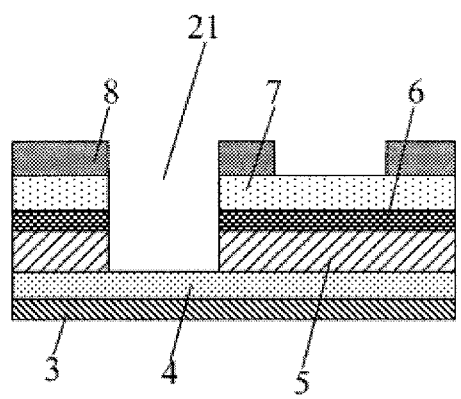
FIG. 4d is a schematic view of removing the photoresist layer in a photoresist partially removed region by an ashing process.

Step S4: performing an ashing process to remove the photoresist layer 8 in a portion of the photoresist partially removed region corresponding to the second alignment mark (as shown in FIG. 4d).

Figure 4E:
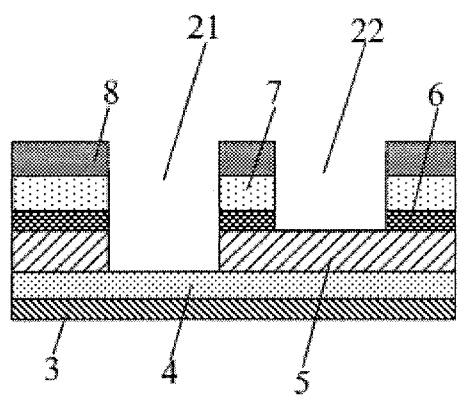
FIG. 4e is a schematic view of forming a second alignment mark.

Step S5: performing a wet etching process on a portion of the source-drain electrode metal film 7 corresponding to the second alignment mark; then performing a dry etching process on a portion of the ohmic contact layer film 6 corresponding to the second alignment mark, so the second alignment mark 22 is formed (as shown in FIG. 4e).

Both the formations of the first alignment mark 21 and the second alignment mark 22 will not increase additional manufacture processes of the array substrate, so, the manufacture is easy and convenient.

In the array substrate and the manufacture method thereof according to the embodiments of the present disclosure, by providing the alignment mark in the same layer as the active layer in the non-display region 9, the source electrode and the drain electrode are respectively precisely align with the two ends of the active layer upon re-fabricating the source electrode and the drain electrode, thereby avoiding abnormal operations of the transistor caused by misalignment between the source electrode as well as the drain electrode and the active layer, and further avoiding unnecessary waste caused by failure of products.

The foregoing embodiments merely are exemplary embodiments of the disclosure, and not intended to define the scope of the disclosure, and the scope of the disclosure is determined by the appended claims.

The present application claims priority of Chinese Patent Application No. 201410534573.2 filed on Oct. 11, 2014, the disclosure of which is incorporated herein by reference in its entirety as part of the present application.

What is claimed is:

1. An array substrate, comprising a display region and a non-display region, the display region comprising a transistor, the transistor comprising a source electrode, a drain electrode and an active layer, the source electrode and the drain electrode being provided on the active layer and being respectively provided at two ends of the active layer, wherein, the non-display region is provided with an alignment mark, the alignment mark is provided in a same layer as the active layer;

the active layer comprises a semiconductor layer and an ohmic contact layer which are sequentially stacked, the ohmic contact layer is provided on the semiconductor layer, and the ohmic contact layer is provided to correspond to and in contact with the source electrode and the drain electrode;

a film for forming the semiconductor layer and a film for forming the ohmic contact layer are further formed in the non-display region; and the alignment mark comprises a first alignment mark, the first alignment mark is formed in the film for forming the semiconductor layer and in the film for forming the ohmic contact layer.

2. The array substrate according to claim 1, wherein the alignment mark further comprises a second alignment mark, the second alignment mark and the first alignment mark are separated from each other, and the second alignment mark is formed in the film for forming the ohmic contact layer.

3. The array substrate according to claim 2, wherein the second alignment mark and the first alignment mark are of same shape and size, the first alignment mark and the second alignment mark are symmetric with respect to a straight line as a symmetry axis, and the straight line passes through a midpoint of a line connecting a central point of the first alignment mark and a central point of the second alignment mark and is perpendicular to the line connecting the central point of the first alignment mark and the central point of the second alignment mark.

4. The array substrate according to claim 3, wherein the first alignment mark comprises a strip-shaped via hole provided in the film for forming the semiconductor layer and in the film for forming the ohmic contact layer, and the second alignment mark comprises a strip-shaped via hole provided in the film for forming the ohmic contact layer.

5. The array substrate according to claim 4, wherein in each of the first alignment mark and the second alignment mark, there are a plurality of strip-shaped via holes;

length directions of a portion of the strip-shaped via holes are parallel to a length direction of the array substrate, and length directions of the other portion of the strip-shaped via holes are parallel to a width direction of the array substrate.

6. The array substrate according to claim 1, wherein there are a plurality of alignment marks, and the plurality of alignment marks are evenly distributed in the non-display region.

* * * * *